(12) United States Patent
Song et al.

(10) Patent No.: US 12,199,061 B2
(45) Date of Patent: Jan. 14, 2025

(54) SEMICONDUCTOR PACKAGES (71) Applicant: SK hynix Inc., Icheon-si (KR)

(72) Inventors: Ha Gyeong Song, Icheon-si (KR);
Byung Jun Bang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 376 days.

(21) Appl. No.: 17/670,775

(22) Filed: Feb. 14, 2022

(65) Prior Publication Data
US 2023/0058485 A1 Feb. 23, 2023

(30) Foreign Application Priority Data

Aug. 23, 2021 (KR) ........................ 10-2021-0111229

(51) Int. Cl.
H01L 25/065 (2023.01)
H01L 23/00 (2006.01)

(52) U.S. Cl.
CPC .............. *H01L 24/49* (2013.01); *H01L 24/05* (2013.01); *H01L 24/06* (2013.01); *H01L 24/16* (2013.01); *H01L 24/48* (2013.01); *H01L 24/73* (2013.01); *H01L 25/0657* (2013.01); *H01L 24/32* (2013.01); *H01L 24/33* (2013.01); *H01L 2224/0401* (2013.01); *H01L 2224/04042* (2013.01); *H01L 2224/06515* (2013.01); *H01L 2224/16145* (2013.01); *H01L 2224/32145* (2013.01); *H01L 2224/32225* (2013.01); *H01L 2224/33181* (2013.01); *H01L 2224/48225* (2013.01); *H01L 2224/49052* (2013.01); *H01L 2224/73203* (2013.01); *H01L 2224/73207* (2013.01); *H01L 2224/73215* (2013.01); *H01L 2225/0651* (2013.01); *H01L 2225/06513* (2013.01); *H01L 2225/06562* (2013.01)

(58) Field of Classification Search
CPC ....................................................... H01L 24/49
See application file for complete search history.

(56) References Cited

U.S. PATENT DOCUMENTS

| | | | | |
|---|---|---|---|---|
| 6,365,978 B1 * | 4/2002 | Ibnabdeljalil | ..... | H01L 23/49816 257/737 |
| 7,927,919 B1 * | 4/2011 | Fan | ................... | H01L 23/49833 438/109 |
| 8,232,631 B2 * | 7/2012 | Cho | ..................... | H01L 25/0657 257/E23.173 |
| 10,128,229 B1 * | 11/2018 | Davis | ................... | H01L 27/0288 |
| 2004/0150084 A1 * | 8/2004 | Nishida | ................... | H01L 24/49 257/E25.013 |

(Continued)

FOREIGN PATENT DOCUMENTS

KR 1020180055047 A 5/2018

*Primary Examiner* — William A Harriston
(74) *Attorney, Agent, or Firm* — WILLIAM PARK & ASSOCIATES LTD.

(57) ABSTRACT

A semiconductor package includes a second semiconductor die stacked on a first semiconductor die. The first semiconductor die includes a first contact pad connected to a first integrated circuit, and includes a second contact pad connected to a third contact pad by a first interconnection line. The second semiconductor die includes a fourth contact pad connected to the third contact pad and connected to a second integrated circuit. A first bonding wire is connected to the first contact pad, and a second bonding wire is connected to the second contact pad.

19 Claims, 10 Drawing Sheets (56) References Cited

U.S. PATENT DOCUMENTS

| | | | |
|---|---|---|---|
| 2009/0273096 A1* | 11/2009 | Hiew | H01L 21/565 |
| | | | 257/E23.024 |
| 2010/0117242 A1* | 5/2010 | Miller | H01L 25/0657 |
| | | | 257/777 |
| 2015/0228587 A1* | 8/2015 | Cheng | H01L 21/78 |
| | | | 257/777 |
| 2018/0102470 A1* | 4/2018 | Das | H01L 23/5384 |
| 2019/0088607 A1* | 3/2019 | Wang | H01L 23/481 |
| 2020/0098724 A1* | 3/2020 | Liff | H01L 23/36 |
| 2020/0286860 A1 | 9/2020 | Lee | |
| 2023/0058485 A1* | 2/2023 | Song | H01L 25/0657 |

\* cited by examiner

SEMICONDUCTOR PACKAGES

CROSS-REFERENCE TO RELATED APPLICATIONS

The present application claims priority under 35 U.S.C 119(a) to Korean Applications No. 10-2021-0111229, filed on Aug. 23, 2021, which is incorporated herein by reference in its entirety.

BACKGROUND

1. Technical Field

The present disclosure generally relates to a semiconductor packaging technology and, more particularly, to a semiconductor package including a connection structure in which a plurality of contact pads are connected.

2. Related Art

As electronic products are miniaturized and improve in performance, demand for portable mobile products is increasing. Semiconductor package products having a large capacity, low power consumption, and/or high-speed operation are required. Attempts are being made to embed a larger number of semiconductor dies in a semiconductor package. Various types of semiconductor package structures in which a plurality of semiconductor dies are stacked on each other have been proposed. A plurality of semiconductor dies are signally and electrically connected using bonding wires.

SUMMARY

An embodiment of a semiconductor package according to the present disclosure includes a first semiconductor die including a first integrated circuit, a first contact pad connected to the first integrated circuit, and a second contact pad and a third contact pad that are connected to each other by a first interconnection line. The semiconductor package also includes a second semiconductor die stacked on the first semiconductor die, the second semiconductor die including a second integrated circuit, and a fourth contact pad overlapping and connected to the third contact pad and connected to the second integrated circuit. The semiconductor package further includes a first bonding wire connected to the first contact pad and a second bonding wire connected to the second contact pad.

Another embodiment of the present disclosure may provide a semiconductor package including a package substrate; a first semiconductor die disposed on the package substrate; a second semiconductor die stacked on the first semiconductor die; and bonding wires.

Each of the first and second semiconductor dies may include an integrated circuit; first contact pads and fifth contact pads disposed to form a first column; third contact pads and sixth contact pads disposed to form a third column; second contact pads disposed to form a second column between the first column and the third column; first interconnection lines respectively connecting the second contact pads and the third contact pads to each other; second interconnection lines connecting the first contact pads to the integrated circuit; and third interconnection lines connecting the fifth contact pads and the sixth contact pads to the integrated circuit and connecting the fifth contact pads and the sixth contact pads to each other.

The second semiconductor die may be stacked on the first semiconductor die such that the first contact pads and the fifth contact pads that are disposed to form the first column of the second semiconductor die are connected to the third contact pads and the sixth contact pads that are disposed to form the third column of the first semiconductor die.

The bonding wires may be respectively connected to the first, second, and fifth contact pads.

Another embodiment of the present disclosure may provide a semiconductor package including a package substrate; a first die stack disposed on the package substrate; a second die stack stacked on the first die stack; and bonding wires.

The first die stack may include a second semiconductor die stacked on a first semiconductor die.

Each of the first and second semiconductor dies may include an integrated circuit; first contact pads and fifth contact pads disposed to form a first column; third contact pads and sixth contact pads disposed to form a third column; second contact pads disposed to form a second column between the first column and the third column; first interconnection lines respectively connecting the second contact pads and the third contact pads to each other; second interconnection lines connecting the first contact pads to the integrated circuit; and third interconnection lines connecting the fifth contact pads and the sixth contact pads to the integrated circuit and connecting the fifth contact pads and the sixth contact pads to each other.

The second semiconductor die may be stacked on the first semiconductor die such that the first contact pads and the fifth contact pads that are disposed to form the first column of the second semiconductor die are connected to the third contact pads and the sixth contact pads that are disposed to form the third column of the first semiconductor die, respectively.

The bonding wires may be respectively connected to the first, second, and fifth contact pads.

DETAILED DESCRIPTION

The terms used herein may correspond to words selected in consideration of their functions in presented embodiments, and the meanings of the terms may be construed to be different according to ordinary skill in the art to which the embodiments belong. If defined in detail, the terms may be construed according to the definitions, Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may refer to a semiconductor package structure in which a structure in which semiconductor substrates are stacked is packaged. The semiconductor substrate may refer to a semiconductor wafer, a semiconductor die, or a semiconductor chip in which electronic components and devices are integrated. The semiconductor chip may refer to a memory chip in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors such as application processors (Aps), graphic processing units (GPUs), central processing units (CPUs) or system-on-chips (SoCs). The semiconductor device may be employed in information communication systems such as mobile phones, electronic systems associated with biotechnology or health care, or wearable electronic systems. The semiconductor device may be applicable to Internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 1:
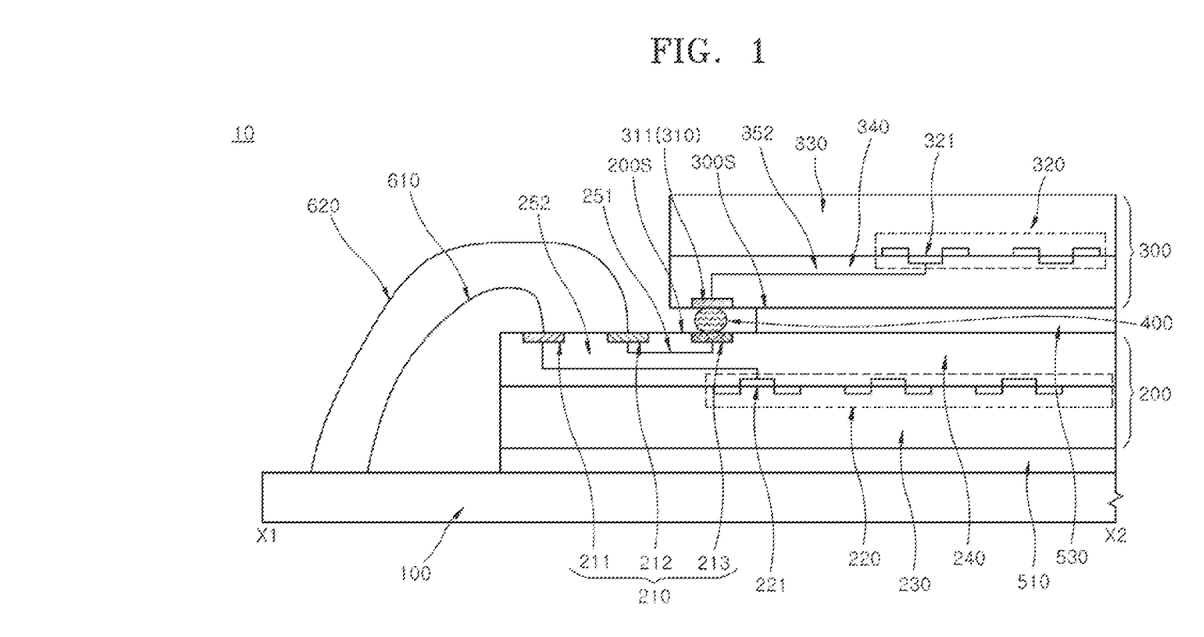
FIGS. 1 and 2 are schematic cross-sectional views illustrating a semiconductor package according to an embodiment of the present disclosure.
Figure 2:
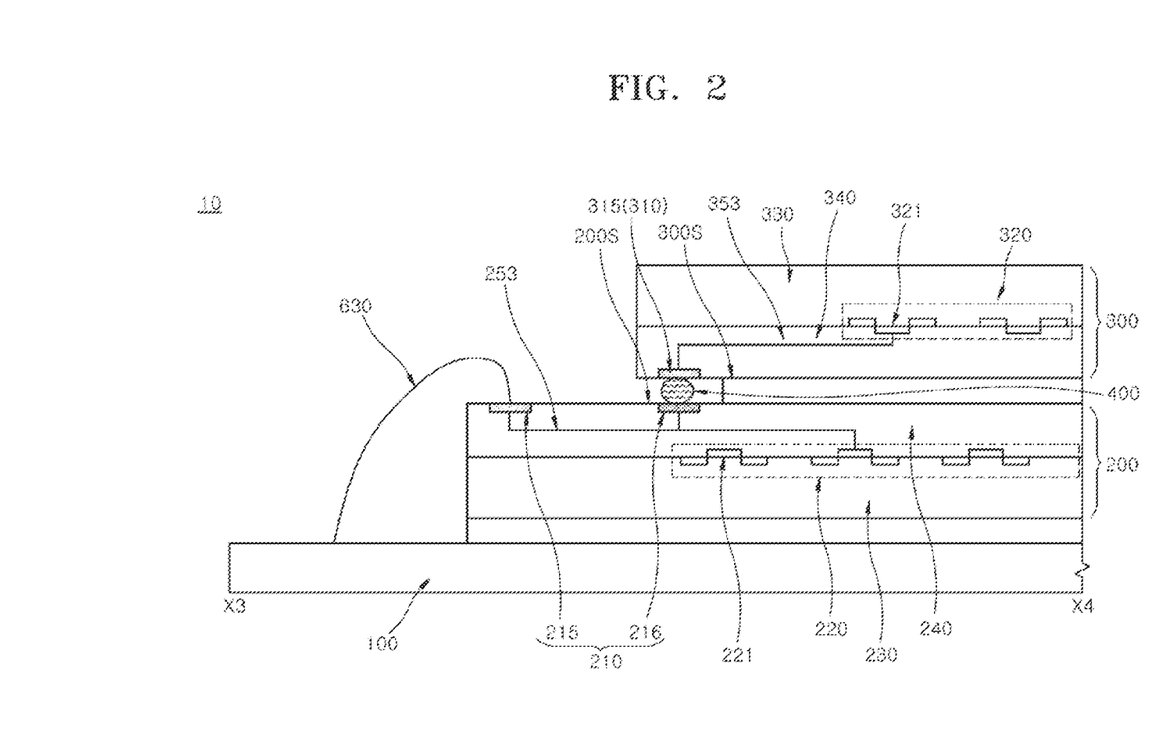
Figure 3:
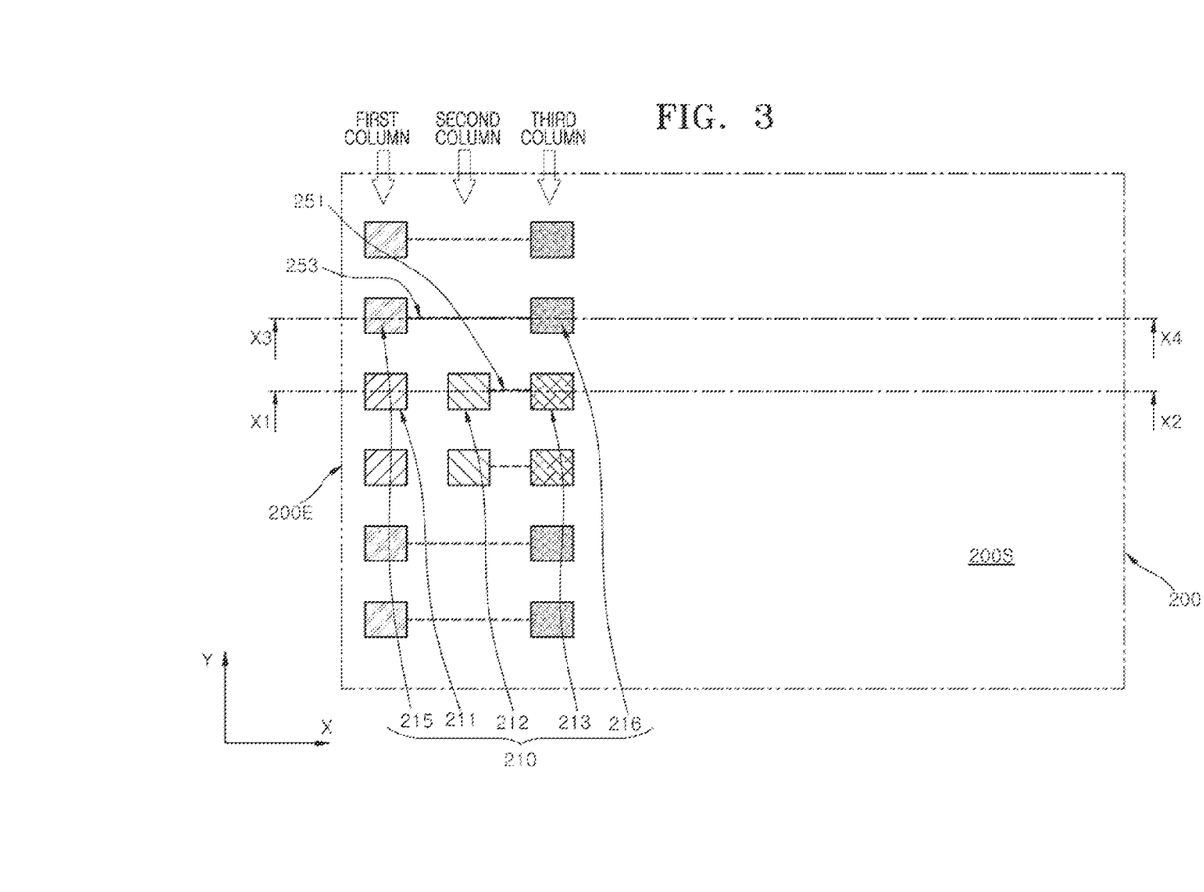
FIG. 3 is a schematic plan view illustrating an arrangement of contact pads of a first semiconductor die of the semiconductor package of FIG. 1.
Figure 4:
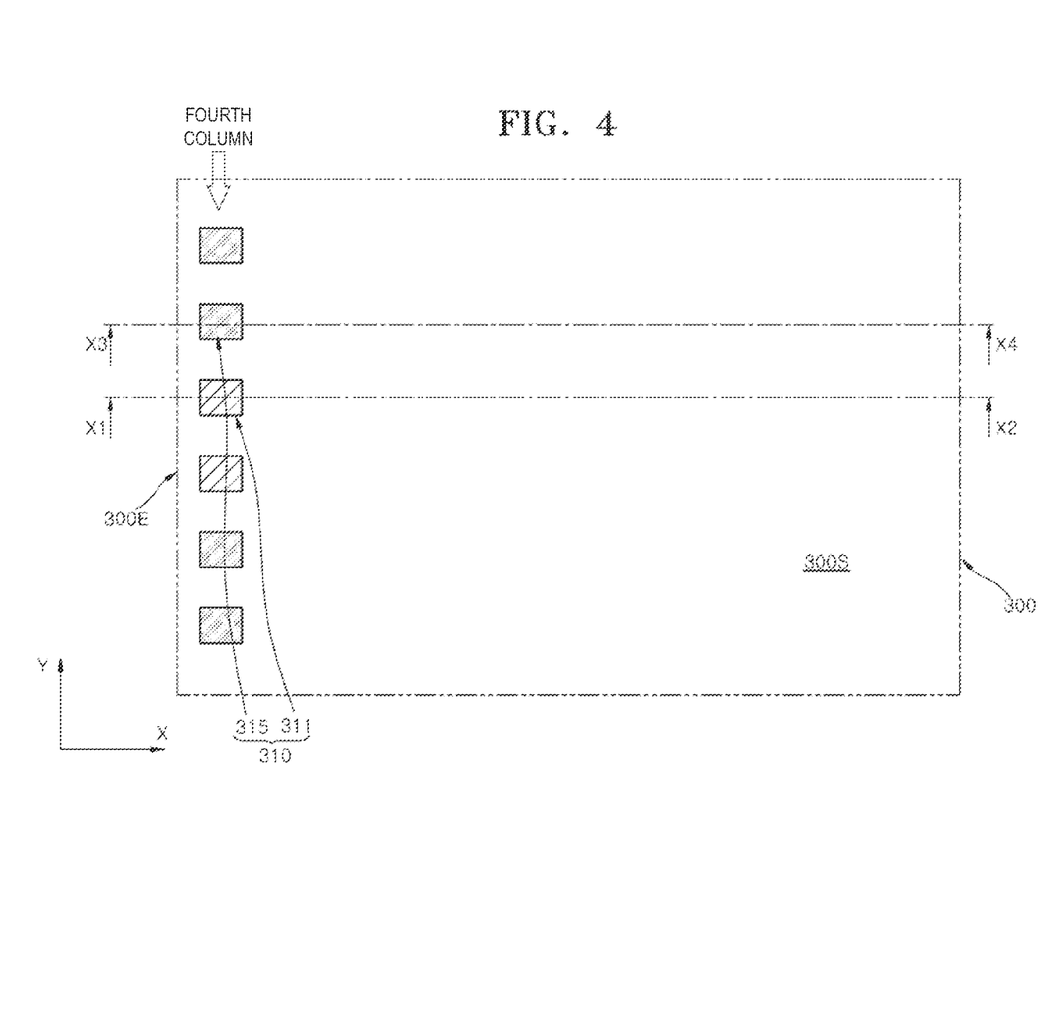
FIG. 4 is a schematic plan view illustrating an arrangement of contact pads of a second semiconductor die of the semiconductor package of FIG. 1.
Figure 5:
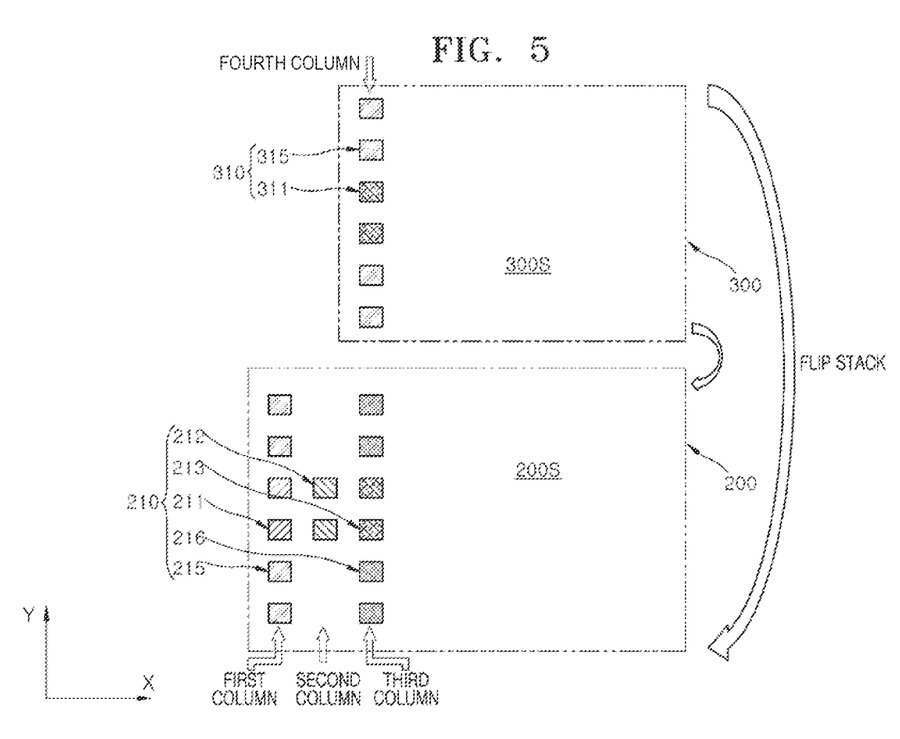
FIG. 5 is a schematic plan view illustrating an arrangement of contact pads of semiconductor dies of the semiconductor package of FIG. 1.

FIGS. 1 and 2 are schematic cross-sectional views illustrating a semiconductor package 10 according to an embodiment of the present disclosure. FIG. 3 is a schematic plan view illustrating an arrangement of contact pads 210 of a first semiconductor die 200 of the semiconductor package 10 of FIG. 1, FIG. 4 is a schematic plan view illustrating an arrangement of contact pads 310 of a second semiconductor die 300 of the semiconductor package 10 of FIG. 1. FIG. 5 is a schematic plan view illustrating an arrangement of the contact pads 210 and 310 of the semiconductor dies 200 and 300 of the semiconductor package 10 of FIG. 1. FIG. 1 is a schematic cross-sectional view illustrating a cross-sectional shape of the semiconductor package 10 taken along the line X1-X2 of FIGS. 3 and 4. FIG. 2 is a schematic cross-sectional view illustrating a cross-sectional shape of the semiconductor package 10 taken along the line X3-X4 of FIGS. 3 and 4.

Referring to FIG. 1, the semiconductor package 10 may include a package substrate 100, the first semiconductor die 200, and the second semiconductor die 300. The package substrate 100 may include interconnection components which electrically connect the first and second semiconductor dies 200 and 300 to external devices, external modules, or external components. In an embodiment, the package substrate 100 may be configured in the form of a printed circuit board (PCB). In an embodiment, the package substrate 100 may be configured in an interconnection structure including conductive patterns disposed in a dielectric layer. The conductive patterns may be redistribution layers (RDL).

The first semiconductor die 200 may include a semiconductor device in which first integrated circuits 220 are integrated. A first integrated circuit 220 may include a plurality of circuit components 221. Active devices such as transistors may be formed in a first semiconductor substrate 230 as the circuit components 221. Passive devices such as capacitors may be formed in the first semiconductor substrate 230 as other circuit components. The first integrated circuit 220 may include a memory device such as a DRAM device or a NAND device. The first integrated circuit 220 may include a controlling circuit for controlling and operating the memory devices.

The first semiconductor die 200 may include the first semiconductor substrate 230 and a first dielectric layer 240. The first semiconductor substrate 230 may include a semiconductor layer such as a silicon (Si) layer. The first integrated circuits 220 may be integrated in the first semiconductor substrate 230, The first dielectric layer 240 may include a dielectric material layer insulating the first integrated circuits 220. The first dielectric layer 240 may include a dielectric material layer such as a silicon oxide ($SiO_2$) layer or a silicon nitride ($Si_3N_4$) layer.

Referring to FIG. 1 together with FIG. 3, the first semiconductor die 200 may include a plurality of contact pads 210 disposed on a surface 200S. The plurality of contact pads 210 may include first contact pads 211, second contact pads 212, and third contact pads 213. Referring to FIGS. 2 and 3 together, the plurality of contact pads 210 may further include fifth contact pads 215 and sixth contact pads 216.

Referring to FIGS. 1 and 3, the first semiconductor die 200 may include first interconnection lines 251 disposed in the first dielectric layer 240. The first interconnection lines 251 may be disposed in the first semiconductor die 200 to connect the second contact pads 212 to the third contact pads 213. Each of the first interconnection lines 251 may be disposed in the first dielectric layer 240 to connect the second contact pads 212 to the third contact pads 213 one to one. The first dielectric layer 240 may insulate the first interconnection lines 251. The first dielectric layer 240 may be disposed on the first semiconductor substrate 230 of the first semiconductor die 200 to electrically insulate the first interconnection lines 251, the second contact pads 212, and the third contact pads 213 from the first integrated circuits 220 embedded in the first semiconductor die 200. The first interconnection lines 251, the second contact pads 212, and the third contact pads 213 may be disposed in the first semiconductor die 200, but may be connecting elements electrically connected to the second semiconductor die 300.

Referring to FIG. 1, the first semiconductor die 200 may further include second interconnection lines 252 spaced apart from the first interconnection lines 251. The second interconnection lines 252 may be disposed in the first dielectric layer 240 of the first semiconductor die 200 to connect the first contact pads 211 to the first integrated circuits 220 of the first semiconductor die 200. The second interconnection lines 252 may substantially penetrate the first dielectric layer 240 to connect the first contacts 211 to the first integrated circuits 220 or the circuit component 221 integrated in the first semiconductor substrate 230.

Referring to FIGS. 2 and 3 together, the first semiconductor die 200 may further include third interconnection lines 253 spaced apart from the first interconnection lines 251 of FIG. 1 and the second interconnection lines 252. The third interconnection lines 253 may connect the fifth contact pads 215 and the sixth contact pads 216 to each other. The third interconnection lines 253 may be disposed in the first dielectric layer 240 to connect the fifth contact pads 215 and the sixth contact pads 216 to each other one to one. The third interconnection lines 253 may connect the fifth contact pads 215 and the sixth contact pads 216 to the first integrated circuits 220 or other circuit components 221.

Referring to FIG. 3, the fifth contact pads 215 may be disposed on the surface 200S of the first semiconductor die 200 while forming a first column with the first contact pads 211. The fifth contact pads 215 and the first contact pads 211 may be disposed to form the first column along a direction in which an edge 200E of the first semiconductor die 200 extends. The direction in which the edge 200E of the first semiconductor die 200 extends may be the X-axis direction in the X-Y plane.

The sixth contact pads 216 may be disposed on the surface 200S of the first semiconductor die 200 while forming a third column with the third contact pads 213. The third column may be spaced apart from the first column in a direction substantially perpendicular to the edge 200E of the first semiconductor die 200. The third column may be positioned to be spaced apart from the first column in the Y-axis direction. The plurality of second contact pads 212 may be disposed in the first semiconductor die 200 while forming a second column between the first column and the third column.

As described above, the contact pads 210 of the first semiconductor die 200 are arranged in three columns, so that the first interconnection lines 251 and the third interconnection lines 253 may be arranged in a relatively simple arrangement. In addition, the second contact pads 212 are disposed to form the second column, the second contact pads 212 may be disposed at positions facing the third contact pads 213 disposed in the third column one to one. Accordingly, the first interconnection lines 251 may be arranged while being spaced apart from each other in the Y-axis direction, so that the first interconnection lines 251 may connect the second contact pads 212 to the third contact pads 213 one to one.

The first contact pads 211 may be disposed at positions in the first column opposite to the second contact pads 212 in the second column, and the fifth contact pads 215 may be disposed at positions in the first column opposite to the sixth contact pads 216 in the third column. Accordingly, some of the third interconnection lines 253 may be arranged while being spaced apart from each other in the Y-axis direction, so that the third interconnection lines 253 may connect the fifth contact pads 215 to the sixth contact pads 216 one to one.

Referring to FIGS. 1 and 4, the second semiconductor die 300 of the semiconductor package 10 may include a semiconductor device in which second integrated circuits 320 are integrated. The second integrated circuit 320 may include a plurality of circuit components 321. Active devices such as transistors may be formed in a second semiconductor substrate 330 as the circuit components 321. Passive elements such as capacitors may be formed in the second semiconductor substrate 330 as other circuit components. The second integrated circuit 320 may include memory devices such as a DRAM device or a NAND device. The second integrated circuit 320 may include a control circuit for controlling and operating the memory devices. The second integrated circuit 320 of the second semiconductor die 300 may include circuits that perform substantially the same function as the first integrated circuit 220 of the first semiconductor die 200. The second integrated circuit 320 of the second semiconductor die 300 may be configured substantially the same as the first integrated circuit 220 of the first semiconductor die 200.

The second semiconductor die 300 may include the second semiconductor substrate 330 and a second dielectric layer 340. The second semiconductor substrate 330 may include a semiconductor layer such as a silicon (Si) layer. The second integrated circuits 320 may be integrated in the second semiconductor substrate 330, The second dielectric layer 340 may include a dielectric material layer insulating the second integrated circuits 320.

The second semiconductor die 300 may include a plurality of contact pads 310 disposed on a surface 300S. The plurality of contact pads 310 may include fourth contact pads 311, Referring to FIGS. 2 and 4 together, the second semiconductor die 300 may further include seventh contact pads 315.

Referring to FIG. 1 again, the second semiconductor die 300 may include fourth interconnection lines 352 disposed in the second dielectric layer 340, The fourth interconnection lines 352 may be disposed in the second dielectric layer 340 of the second semiconductor die 300 to connect the fourth contact pads 311 to the second integrated circuit 320 of the second semiconductor die 300. The fourth interconnection lines 352 may substantially penetrate the second dielectric layer 340 to connect the fourth contact pads 311 to the second integrated circuit 320 or the circuit component 321 integrated in the second semiconductor substrate 330.

Referring to FIG. 2 again, the second semiconductor die 300 may further include fifth interconnection lines 353 spaced apart from the fourth interconnection lines 352 of FIG. 1. The fifth interconnection lines 353 may substantially penetrate the second dielectric layer 340 to connect the seventh contact pads 315 to the second integrated circuits 320 or other circuit components 321.

Referring to FIG. 4 again, the seventh contact pads 315 may be disposed on the surface 300S of the second semiconductor die 300 while forming a fourth column with the fourth contact pads 311. The seventh contact pads 315 and the fourth contact pads 311 may be disposed while forming the fourth column along a direction in which an edge 300E of the second semiconductor die 300 extends. The direction in which the edge 300E of the second semiconductor die 300 extends may be the X-axis direction in the X-Y plane.

Referring to FIG. 5, the fourth column of the contact pads 310 of the second semiconductor die 300 including the seventh contact pads 315 and the fourth contact pads 311 may have substantially the same pad arrangement as the first column of the contact pads 210 of the first semiconductor die 200 including the fifth contact pads 215 and the first contact pads 211. The fourth column of the contact pads 310 of the second semiconductor die 300 including the seventh contact pads 315 and the fourth contact pads 311 may have substantially the same pad arrangement as the third column of the contact pads 210 of the first semiconductor die 200 including the third contact pads 213 and the sixth contact pads 216.

Referring to FIGS. 1 and 5 together, the second semiconductor die 300 may be stacked on the first semiconductor die 200. The second semiconductor die 300 may be flipped and stacked on the first semiconductor die 200 so that the surface 300S of the second semiconductor die 300 faces the surface 200S of the first semiconductor die 200. The second semiconductor die 300 may be flip stacked on the first semiconductor die 200 such that the fourth contact pads 311 of the second semiconductor die 300 face the third contact pads 213 of the first semiconductor die 200 one to one. As illustrated in FIG. 1, the second semiconductor die 300 may be stacked on the first semiconductor die 200 while covering the third contact pads 213 and exposing the second contact pads 212 and the first contact pads 211.

Referring to FIG. 1, conductive bumps 400 may be disposed between the fourth contact pads 311 of the second semiconductor die 300 and the third contact pads 213 of the first semiconductor die 200 which face each other. The conductive bumps 400 may electrically connect the third contact pads 213 and the fourth contact pads 311 to each other. The conductive bumps 400 may be connectors bonded to the third contact pads 213 and the fourth contact pads 311.

Referring to FIGS. 2 and 5, the second semiconductor die 300 may be flip stacked on the first semiconductor die 200 such that the seventh contact pads 315 of the second semiconductor die 300 face the sixth contact pads 216 of the first semiconductor die 200 one to one. As illustrated in FIG. 2, the second semiconductor die 300 may be stacked on the first semiconductor die 200 while covering the sixth contact pads 216 and exposing the fifth contact pads 215. The seventh contact pads 315 of the second semiconductor die 300 may be disposed in the second semiconductor die 300 to be connected to the sixth contact pads 216 of the first semiconductor die 200 one to one. The conductive bumps 400 may electrically connect the sixth contact pads 216 and the seventh contact pads 315 to each other.

Referring back to FIG. 1, the first semiconductor die 200 may be disposed on the package substrate 100 while being bonded to the package substrate 100 by a first adhesive layer 510. The second semiconductor die 300 may be stacked on the first semiconductor die 200 while being bonded to the first semiconductor die 200 by a second adhesive layer 530. The first contact pads 211 and the second contact pads 212 of the first semiconductor die 200 may be exposed outside the stacked second semiconductor die 300.

The semiconductor package 10 may include first bonding wires 610 respectively connected to the first contact pads 211. The first bonding wires 610 may electrically connect the first contact pads 211 to the package substrate 100. The semiconductor package 10 may further include second bonding wires 620 respectively connected to the second contact pads 212. The second bonding wires 620 may electrically connect the second contact pads 212 to the package substrate 100.

Referring to FIG. 2 again, the semiconductor package 10 may further include third bonding wires 630 respectively connected to the fifth contact pads 215, The third bonding wires 630 may electrically connect the fifth contact pads 215 to the package substrate 100. The third bonding wires 630 may electrically connect the second integrated circuit 320 of the second semiconductor die 300 to the package substrate 100 through the fifth contact pad 215, the third interconnection line 253, the sixth contact pad 216, the conductive bump 400, the seventh contact pad 315, and the fifth interconnection line 353, The third bonding wires 630 may electrically connect the first integrated circuit 220 of the first semiconductor die 200 to the package substrate 100 through the fifth contact pads 215 and the third interconnection line 253, As such, the third bonding wires 630 may commonly connect the first integrated circuits 220 of the first semiconductor die 200 and the second integrated circuits 320 of the second semiconductor die 300 to the package substrate 100.

Data stored in the first integrated circuits 220 may be transmitted to the package substrate 100 through the third bonding wires 630. Data signals such as DQ stored in the second integrated circuit 320 may be transmitted to the package substrate 100 through the third bonding wires 630. The data signals to be stored in the first integrated circuits 220 may be transmitted through the third bonding wires 630. The data signals to be stored in the second integrated circuits 320 may be transmitted through the third bonding wires 630.

Referring to FIG. 1 again, the first bonding wires 610 may electrically connect the first integrated circuits 220 of the first semiconductor die 200 to the package substrate 100 through the first contact pads 211 and the second interconnection lines 252. The first wires 610 may exclusively connect the first integrated circuits 220 of the first semiconductor die 200 to the package substrate 100, The first bonding wires 610 may electrically connect the first integrated circuits 220 of the first semiconductor die 200 and the package substrate 100 to each other, but might not be electrically connected to the second semiconductor die 300 or the second integrated circuits 320. The first dielectric layer 240 may electrically insulate the first contact pads 211 and the second interconnection lines 252 from the second semiconductor die 300.

The first bonding wires 610 are exclusively connected to the first semiconductor die 200 or the first integrated circuits 220 through the first contact pads 211 and the second interconnection lines 252, so that it is possible to transmit a control signal for operating the first integrated circuits 220 only to the first integrated circuits 220 through the first bonding wires 610. It is possible to transmit the control signal only to the first integrated circuits 220 through the first bonding wire 610, the first contact pad 211, and the second interconnection line 252 without transmitting the control signal to the second integrated circuits 320. The control signal to be transmitted only to the first integrated circuits 220 may include command and address (CA) signals. The control signal to be transmitted only to the first integrated circuits 220 may include a chip selection (CS) signal. The control signal to be transmitted only to the first integrated circuits 220 may include various option signals required for the operation of only the first integrated circuits 220.

The second bonding wires 620 may electrically connect the second integrated circuits 320 of the second semiconductor die 300 to the package substrate 100 through the second contact pad 212, the first interconnection line 251, the third contact pad 213, the conductive bump 400, the fourth contact pad 311, and the fourth interconnection line 352. The second bonding wires 620 may exclusively connect the second integrated circuits 320 of the second semiconductor die 300 to the package substrate 100. The second bonding wires 620 may electrically connect the second integrated circuits 320 of the second semiconductor die 300 to the package substrate 100, but might not be electrically connected to the first semiconductor die 200 or the first integrated circuits 220. The first dielectric layer 240 may electrically insulate the second contact pads 212, the first interconnection lines 251, and the third contact pads 213 from the first integrated circuits 220 of the first semiconductor die 200.

The second bonding wires 620 may be exclusively connected to the second semiconductor die 300 or the second integrated circuits 320, so that it is possible to transmit a control signal for operating the second integrated circuits 320 only to the second integrated circuits 320 through the second bonding wires 620. It is possible to transmit a control signal for operation only to the second integrated circuits 320 through the second bonding wire 620, the second contact pad 212, the first interconnection line 251, the third contact pad 213, the conductive bump 400, the fourth contact pad 311, and the fourth interconnection line 352 without transmitting the control signal to the first integrated circuits 220. The control signal to be transmitted only to the second integrated circuits 320 may include command and address (CA) signals. The control signal to be transmitted only to the second integrated circuits 320 may include a chip selection (CS) signal. The control signal to be transmitted only to the second integrated circuits 320 may include various option signals required for the operation of only the second integrated circuits 320.

As described above, it is possible to exclusively transmit CA signals only to the first semiconductor die 200 or the first integrated circuits 220 through the first bonding wires 610, to exclusively transmit CA signals only to the second semiconductor die 300 or the second integrated circuits 320 through the second bonding wires 620, and to exclusively transmit DQ signals to the first integrated circuits 220 or the second integrated circuits 320 through the third bonding wires 630. Accordingly, bonding wires to be directly connected to the second semiconductor die 300 may be omitted. Because the bonding wires to be directly connected to the second semiconductor die 300 may be omitted, signal reflection that may pass through the bonding wires directly connected to the second semiconductor die 300 may be reduced. Accordingly, signal integrity (SI) of the semiconductor package 10 may be improved.

Figure 6:
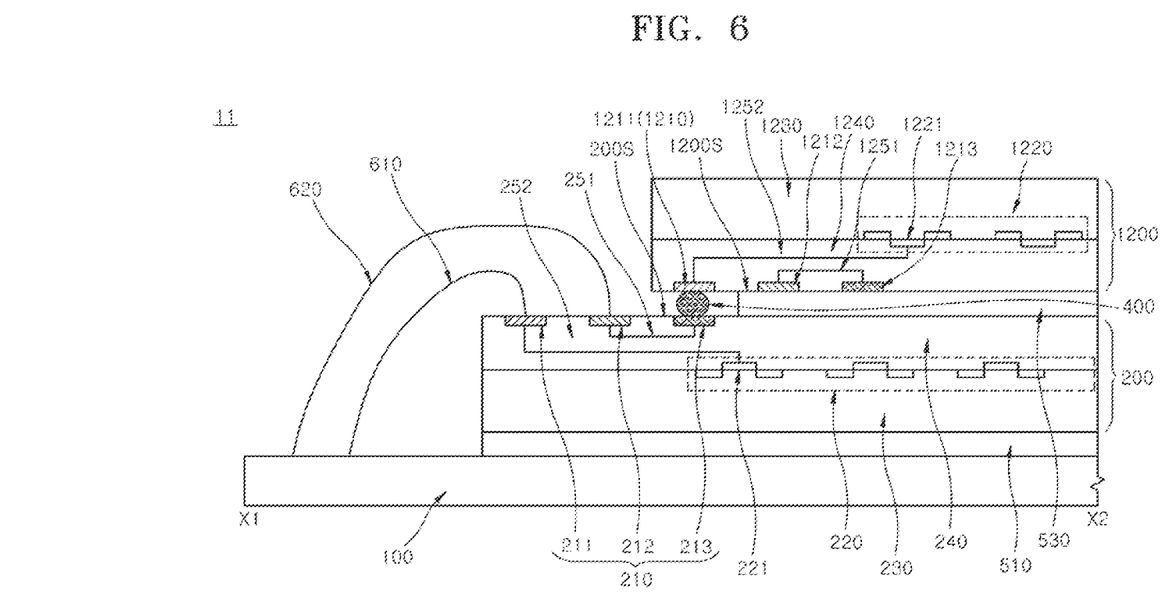
FIGS. 6 and 7 are schematic cross-sectional views illustrating a semiconductor package according to another embodiment of the present disclosure.
Figure 7:
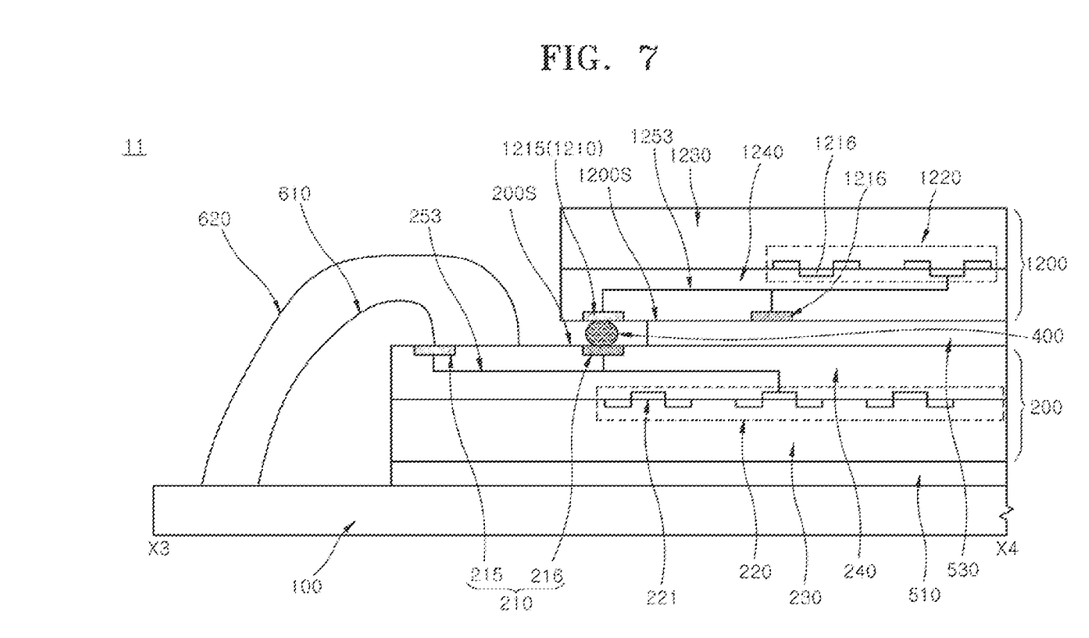
Figure 8:
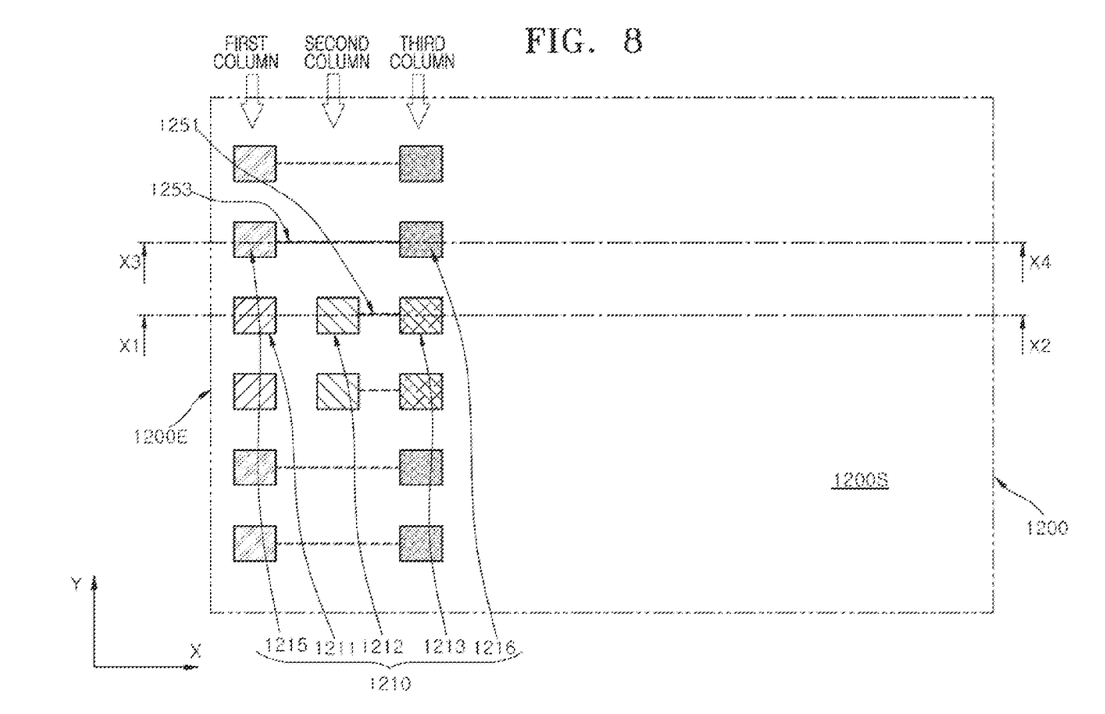
FIG. 8 is a schematic plan view illustrating an arrangement of contact pads of a second semiconductor die of the semiconductor package of FIG. 6.

FIGS. 6 and 7 are schematic cross-sectional views illustrating a semiconductor package 11 according to another embodiment of the present disclosure, FIG. 8 is a schematic plan view illustrating an arrangement of contact pads 1210 of a second semiconductor die 1200 of the semiconductor package 11 of FIG. 6, FIG. 6 is a schematic cross-sectional view illustrating a cross-sectional shape of the semiconductor package 11 taken along the line X1-X2 of FIG. 8. FIG. 7 is a schematic cross-sectional view illustrating a cross-sectional shape of the semiconductor package 11 taken along the line X3-X4 of FIG. 8. In FIGS. 6 and 7, the components indicated by the same reference numerals as those of FIGS. 1 to 3 may be substantially the same as the components described with reference to FIGS. 1 to 3.

Referring to FIGS. 6 and 7, the semiconductor package 11 may include a package substrate 100, a first semiconductor die 200, a second semiconductor die 1200, first bonding wires 610, second bonding wires 620, and third bonding wires 630. The first semiconductor die 200 may be configured substantially the same as the first semiconductor die 200 of the semiconductor package 10 described with reference to FIGS. 1 to 3 and FIG. 5, The second semiconductor die 1200 may be configured substantially the same as the first semiconductor die 200.

The first semiconductor die 200 may include first integrated circuits 220, a first semiconductor substrate 230, a first dielectric layer 240, contact pads 210, first interconnection lines 251, second interconnection lines 252, and third interconnection lines 253. The second semiconductor die 1200 may include first integrated circuits 1220, a first semiconductor substrate 1230, a first dielectric layer 1240, contact pads 1210, first interconnection lines 1251, second interconnection lines 1252, and third interconnection lines 1253. The first integrated circuits 220 and 1220 of the first and second semiconductor dies 200 and 1200 may include circuit components 221 and 1221, respectively. The first dielectric layers 240 and 1240 of the first and second semiconductor dies 200 and 1200 may electrically insulate the first interconnection lines 251 and 1251, the second contact pads 212 and 1212, and the third contact pads 213 and 1213 from the first integrated circuits 220 and 1220, respectively.

Referring to FIGS. 6, 7, and 8, the first and second semiconductor dies 200 and 1200 may include the first contact pads 211 and 1211 and fifth contact pads 215 and 1215, respectively, which are disposed to form a first column. The first and second semiconductor dies 200 and 1200 may further include the third contact pads 213 and 1213, and sixth contact pads 216 and 1216, respectively, which are disposed to form a third column. The first and second semiconductor dies 200 and 1200 may further include the second contact pads 212 and 1212, respectively, which are disposed to form a second column between the first column and the third column.

The first interconnection lines 251 and 1251 may connect the second contact pads 212 and 1212 and the third contact pads 213 and 1213 to each other, respectively. The second interconnection lines 252 and 1252 may connect the first contact pads 211 and 1211 to the first integrated circuits 220 and 1220, respectively. The third interconnection lines 253 and 1253 may connect the fifth contact pads 215 and 1215 and the sixth contact pads 216 and 1216 to each other, and may connect the fifth contact pads 215 and 1215 and the sixth contact pads 216 and 1216 to the first integrated circuits 220 and 1220, respectively. The bonding wires 610, 620, and 630 may be connected to the first contact pads 211 and 1211, the second contact pads 212 and 1212, and the fifth contact pads 215 and 1215, respectively.

The second semiconductor die 1200 may be stacked on the first semiconductor die 200 such that the first contact pads 1211 and the fifth contact pads 1215 of the second semiconductor die 1200 which are disposed to form the first column of the second semiconductor die 1200 are connected to the third contact pads 213 and the sixth contact pads 216 of the first semiconductor die 200 which are disposed to form the third column of the first semiconductor die 200, respectively.

The second semiconductor 1200 may be stacked on the first semiconductor die 200 while covering the third contact pads 213 and the sixth contact pads 216 of the third column of the first semiconductor die 200 and exposing the second contact pads 212 of the second column of the first semiconductor die 200 and the first contact pads 211 and the fifth contact pads 215 of the first column of the first semiconductor die 200.

Figure 9:
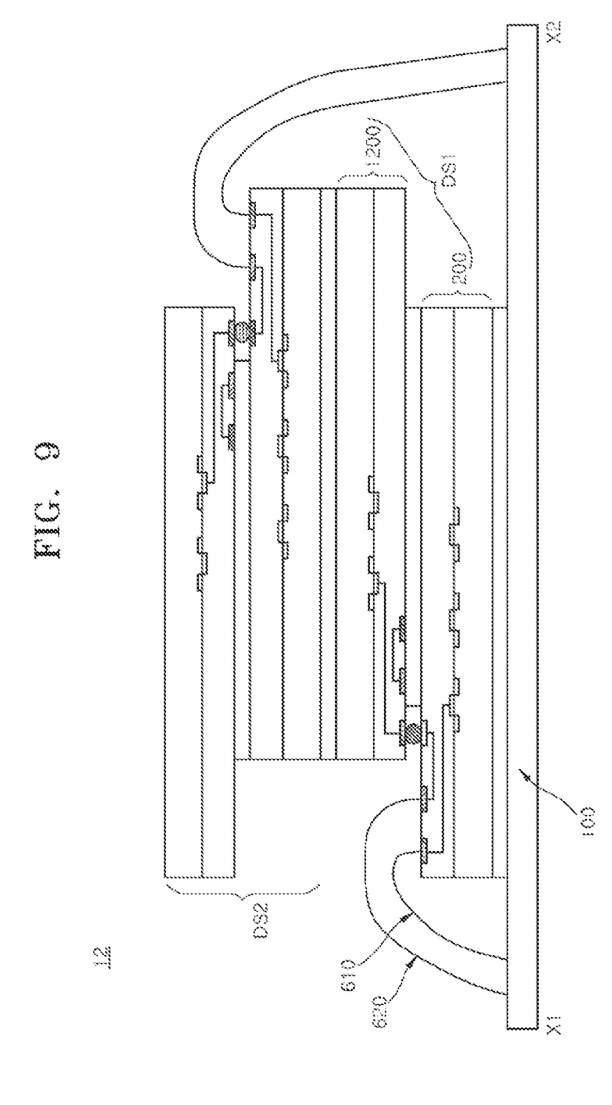
FIG. 9 is a schematic cross-sectional view illustrating a semiconductor package according to another embodiment of the present disclosure.

FIG. 9 is a schematic cross-sectional view illustrating a semiconductor package 12 according to another embodiment of the present disclosure. In FIG. 9, the same reference numerals as the reference numerals presented in FIG. 6 may indicate the same components as those described with reference to FIG. 6.

Referring to FIG. 9, the semiconductor package 12 may include a package substrate 100, a first die stack DS1, a second die stack DS2, and bonding wires 610 and 620. The first die stack DS1 may be disposed on the package substrate 100. The second die stack DS2 may be stacked on the first the stack DS1.

The first the stack DS1 may include a first semiconductor the 200 and a second semiconductor die 1200. The first the stack DS1 may include the second semiconductor die 1200 stacked on the first semiconductor die 200. The first semiconductor die 200 and the second semiconductor die 1200 may be configured as illustrated in FIGS. 6 to 8 and described with reference to FIGS. 6 to 8.

The second die stack DS2 may be configured to have substantially the same shape as the first die stack DS1. The second die stack DS2 may have a shape substantially the same as a shape obtained by rotating the first die stack DS1 by 180 degrees (180°) on a surface of the package substrate 100 and may be stacked on the first die stack DS1.

Figure 10:
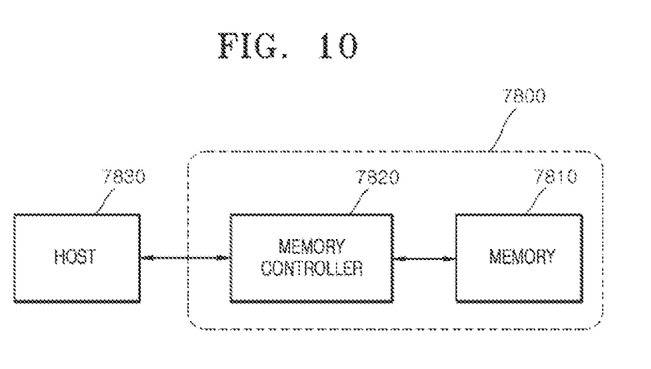
FIG. 10 is a block diagram illustrating an electronic system employing a memory card including a package according to an embodiment of the present disclosure.

FIG. 10 is a block diagram illustrating an electronic system including a memory card 7800 employing at least one semiconductor package according to an embodiment of the present disclosure. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
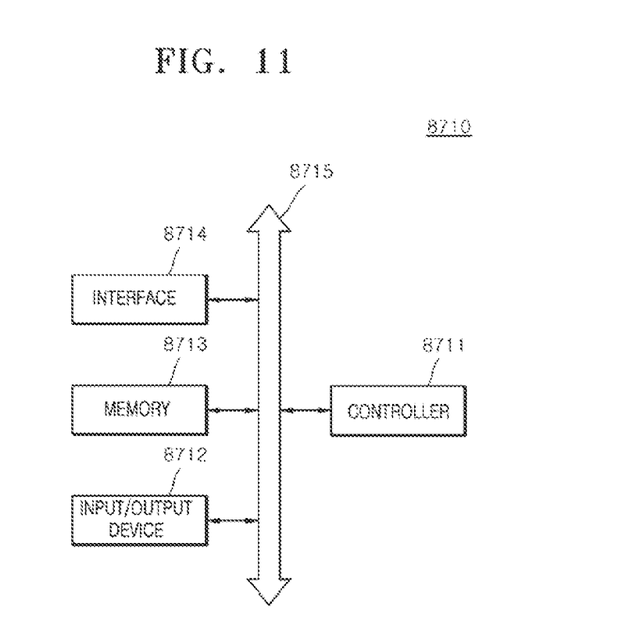
FIG. 11 is a block diagram illustrating an electronic system including a package according to an embodiment of the present disclosure.

FIG. 11 is a block diagram illustrating an electronic system 8710 including at least one semiconductor package according to an embodiment of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM device and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but an illustrative standpoint. The scope of the present teachings is not limited to the above descriptions but is defined by the accompanying claims, and all of distinctive features in the equivalent scope should be construed as being included in the inventive concept.

What is claimed is:

1. A semiconductor package comprising:
   a first semiconductor die including:
      a first integrated circuit;
      a first contact pad connected to the first integrated circuit;
      a second contact pad and a third contact pad that are connected to each other by a first interconnection line;
      a fifth contact pad and a sixth contact pad; and
      a third interconnection line connecting the fifth contact pad and the sixth contact pad to the first integrated circuit and connecting the fifth contact pad and the sixth contact pad to each other; and
   a second semiconductor die stacked on the first semiconductor die, the second semiconductor die including:
      a second integrated circuit; and
      a fourth contact pad overlapping and connected to the third contact pad and connected to the second integrated circuit;
   a first bonding wire connected to the first contact pad; and
   a second bonding wire connected to the second contact pad.

2. The semiconductor package of claim 1, wherein the first semiconductor die further includes a dielectric layer that electrically insulates the first interconnection line, the second contact pad, and the third contact pad from the first integrated circuit.

3. The semiconductor package of claim 2, wherein the dielectric layer electrically insulates the first contact pad from the second semiconductor die.

4. The semiconductor package of claim 1, wherein the first semiconductor die further includes a second interconnection line connecting the first contact pad to the first integrated circuit.

5. The semiconductor package of claim 1,
   wherein the fifth contact pad is disposed on the first semiconductor die and forms a first column with the first contact pad, wherein the sixth contact pad is disposed on the first semiconductor die and forms a third column with the third contact pad, and wherein a plurality of the second contact pads are disposed on the first semiconductor die and forms a second column between the first column and the third column.

6. The semiconductor package of claim 1 wherein the second semiconductor die further includes a seventh interconnection line overlapping and connected to the sixth contact pad and connected to the second integrated circuit.

7. The semiconductor package of claim 6, wherein the seventh contact pad is disposed on the second semiconductor die and forms a column with the fourth contact pad.

8. The semiconductor package of claim 6, further comprising a third bonding wire connected to the fifth contact pad, wherein the third bonding wire is electrically connected to the second integrated circuit through the fifth contact pad, the third interconnection line, the sixth contact pad, and the seventh contact pad.

9. The semiconductor package of claim 8, further comprising a package substrate to which the first, second, and third bonding wires are electrically connected, wherein the third bonding wire commonly connects the first integrated circuit and the second integrated circuit to the package substrate, wherein the first bonding wire exclusively connects the first integrated circuit to the package substrate, and wherein the second bonding wire exclusively connects the second integrated circuit to the package substrate.

10. The semiconductor package of claim 1, wherein the second semiconductor die is stacked on the first semiconductor so that:

the third contact pad is covered; and
the second and first contact pads are left exposed.

11. The semiconductor package of claim 1, wherein the second semiconductor die is stacked on the first semiconductor die such that the fourth contact pad faces the third contact pad.

12. The semiconductor package of claim 11, further comprising a conductive bump disposed between the third contact pad and the fourth contact pad and connecting the third contact pad to the fourth contact pad.

13. A semiconductor package comprising:
a package substrate;
a first semiconductor die disposed on the package substrate;
a second semiconductor die stacked on the first semiconductor die; and
bonding wires,
wherein each of the first and second semiconductor dies includes:
an integrated circuit;
first contact pads and fifth contact pads disposed to form a first column;
third contact pads and sixth contact pads disposed to form a third column;
second contact pads disposed to form a second column between the first column and the third column;
first interconnection lines respectively connecting the second contact pads and the third contact pads to each other;
second interconnection lines connecting the first contact pads to the integrated circuit; and
third interconnection lines connecting the fifth contact pads and the sixth contact pads to the integrated circuit and connecting the fifth contact pads and the sixth contact pads to each other, wherein the second semiconductor die is stacked on the first semiconductor die such that the first contact pads and the fifth contact pads that are disposed to form the first column of the second semiconductor die are connected to the third contact pads and the sixth contact pads that are disposed to form the third column of the first semiconductor die, respectively, and wherein the bonding wires are respectively connected to the first, second, and fifth contact pads.

14. The semiconductor package of claim 13, wherein the first semiconductor die further includes a dielectric layer that electrically insulates the first interconnection lines, the second contact pads, and the third contact pads from the integrated circuit.

15. The semiconductor package of claim 13, wherein the second semiconductor die is stacked on the first semiconductor die so that:

the third contact pads and the sixth contact pads of the third column of the first semiconductor die are covered; and the second contact pads of the second column of the first semiconductor die and the first contact pads and the fifth contact pads of the first column of the first semiconductor die are left exposed.

16. A semiconductor package comprising:
a package substrate;
a first die stack disposed on the package substrate;
a second die stack stacked on the first die stack; and
bonding wires,
wherein the first die stack includes a second semiconductor die stacked on a first semiconductor die,
wherein each of the first and second semiconductor dies includes:
an integrated circuit;
first contact pads and fifth contact pads disposed to form a first column;
third contact pads and sixth contact pads disposed to form a third column;
second contact pads disposed to form a second column between the first column and the third column;
first interconnection lines respectively connecting the second contact pads and the third contact pads to each other;
second interconnection lines connecting the first contact pads to the integrated circuit; and
third interconnection lines connecting the fifth contact pads and the sixth contact pads to the integrated circuit and connecting the fifth contact pads and the sixth contact pads to each other, wherein the second semiconductor die is stacked on the first semiconductor die such that the first contact pads and the fifth contact pads that are disposed to form the first column of the second semiconductor die are connected to the third contact pads and the sixth contact pads that are disposed to form the third column of the first semiconductor die, respectively, and wherein the bonding wires are respectively connected to the first, second, and fifth contact pads.

17. The semiconductor package of claim 16, wherein the first semiconductor die further includes a dielectric layer that electrically insulates the first interconnection lines, the second contact pads, and the third contact pads from the integrated circuit.

18. The semiconductor package of claim 16, wherein the second semiconductor die is stacked on the first semiconductor die so that:
- the third contact pads and the sixth contact pads of the third column of the first semiconductor die are covered; and
- the second contact pads of the second column of the first semiconductor die and the first contact pads and the fifth contact pads of the first column of the first semiconductor die are left exposed.

19. The semiconductor package of claim 16, wherein the second die stack has a shape substantially the same as a shape obtained by rotating the first die stack 180 degrees (180°) on a surface of the package substrate.

* * * * *